United States Patent [19]

Kanda et al.

[11] 4,025,941

[45] May 24, 1977

[54] HALL ELEMENT

[75] Inventors: Yozo Kanda; Michiyoshi Maki; Masatoshi Migitaka; Kikuji Sato, all of Kokubunji, Japan

[73] Assignee: Hitachi, Ltd., Japan

[22] Filed: Apr. 8, 1975

[21] Appl. No.: 566,092

[30] Foreign Application Priority Data

Apr. 26, 1974 Japan .............................. 49-46478

[52] U.S. Cl. .................................. 357/27; 307/309; 357/26; 357/48; 357/60
[51] Int. Cl.² ................... H01L 27/22; H01L 43/06; H01L 29/04
[58] Field of Search .................... 357/26, 27, 60; 307/309

[56] References Cited

UNITED STATES PATENTS

| | | | |
|---|---|---|---|
| 2,714,182 | 7/1955 | Hewitt, Jr. | 357/60 |
| 3,476,991 | 11/1969 | Mize et al. | 357/60 |
| 3,522,494 | 8/1970 | Bosch | 357/27 |
| 3,747,201 | 7/1973 | Arai | 357/27 |
| 3,769,562 | 10/1973 | Bean | 357/60 |

Primary Examiner—William D. Larkins
Attorney, Agent, or Firm—Craig & Antonelli

[57] ABSTRACT

A Hall element comprises a thin plate of n-type Si, the face of which accords with a {110} atomic plane, wherein the direction from one current electrode to the other current electrode is substantially <100> or <110> crystalline direction to which the direction from one Hall voltage electrode to the other Hall voltage electrode is substantially normal. This Hall element has a very low unbalanced voltage caused by the strain generated during the process of packaging.

11 Claims, 3 Drawing Figures

HALL ELEMENT

BACKGROUND OF THE INVENTION

1. Field of the Invention

The present invention relates to a Hall element composed of n-type Si, and particularly to a Si Hall element having a very low unbalanced voltage.

2. Brief Description of the Prior Art

Hitherto, in many cases, a Hall element was composed of a thin rectangular semiconductor plate, near two opposite edges of which the current electrodes having lengths approximately equal to that of the edges are attached, and at the centers of the other two opposite edges Hall voltage electrodes of small size are attached for the purpose of picking up the output signal. Under ideal conditions, when no magnetic field is applied, no output voltage arises at the Hall voltage electrodes even when a current is applied at the current electrodes.

However, practically speaking, because of lack of uniformity of the current density caused by lack of uniformity of the semiconductor material, lack of uniformity of the element thickness and/or unsatisfactory location of the electrode, an unbalanced voltage, namely the Hall voltage, arises at the output electrodes even when no magnetic field is applied; and an error thereby arises. Recently, owing to great advancements on the technical side of integrated circuit manufacture, the inherent unbalanced voltage of the Hall element, i.e. the unbalanced voltage of a Hall element included in a bare pellet, has been considerably lowered. On the other hand, because of the piezo-resistive effect, it is unavoidable that the unbalanced voltage will increase markedly when a pellet including the Hall element is packaged, that is when the pellet is bonded to a metallic frame, the lead wire is attached and then this pellet is moulded with resin thereby generating a thermal strain and a mechanical strain in the pellet. For this reason, for example, even though a brushless d.c. motor, to which the IC (integrated circuit) having a Si Hall element is attached has theoretical advantages, it has hitherto been difficult to put this motor to practical use.

SUMMARY OF THE INVENTION

The object of this invention is to provide a Si Hall element in which the above mentioned difficulty of previous Hall elements is markedly lowered, i.e. to substantially lower the unbalanced voltage even in a strained state.

Other and further objects, features and advantages of the invention will appear more fully from the following description.

The Hall element of the present invention is designed so as to make the {110} atomic plane of n-type Si crystal substantially normal to an applied magnetic flux, i.e. to make the face of the thin plate of n-type Si crystal of the Hall element substantially parallel to the {110} atomic plane of said Si crystal, in order to achieve the above mentioned object. In previous Hall elements, said face is usually substantially parallel to the {100} or {111} atomic plane.

The Hall element of the present invention, designed according to the foregoing, has a lower probability of the existence of a high unbalanced voltage, than heretofore, and is very effective in this respect. Furthermore, the Hall element of the present invention, in which the direction (which is also referred to as the "current direction") from the center of one current electrode to the center of the other current electrode is substantially <100> or <110> crystalline direction (this current direction may be allowable within ±15° of <100> or <110>) and the direction from one Hall voltage electrode to the other Hall voltage electrode is substantially normal to the current direction, in addition to the above condition concerning the face of the Si thin plate, also has a decidedly lower unbalanced voltage and is preferable. In this case, the Hall voltage electrodes are on the middle line between the current electrodes.

Furthermore, the above mentioned Hall element on a pellet which has active elements such as transistors and passive elements such as resistors or capacitors has a very low unbalanced voltage and excellent qualities even under the considerable strain of packaging, that is the bonding to a frame, wire-bonding, moulding with resin and so on.

As the Si Hall element of the present invention has a very low unbalanced voltage, as apparent from the foregoing discussion, it is suitable, for example, for brushless d.c. motors.

Other and further features and advantages of the invention will be apparent from the following description taken in connection with the accompanying drawing.

DETAILED DESCRIPTION OF THE INVENTION

As stated in the foregoing, the Hall element according to the present invention is characterized in that said element is designed to make the face of the thin plate of n-type Si crystal for said element substantially parallel to the {110} atomic plane. Table 1 shows the unbalanced voltages of Hall elements having faces of various atomic planes. The details of Table 1 will be mentioned in the description concerning Example 1 later. As seen from Table 1, the average value of the unbalanced voltage for a Hall element having a face of {110} atomic plane according to the invention is about 3.2 mV where the current direction is <100> crystalline direction. However the voltage becomes greater than 20 mV in Hall elements having faces of (100) or (111) atomic plane.

Accordingly, by means of the present invention, it becomes possible to lower markedly the unbalanced voltage in a Hall element and to greatly improve a Hall element, by making the face of said element parallel to the {110} atomic plane. However, even though said face is parallel to the {110} atomic plane, the unbalanced voltage of the Hall element can take various values according to the positions of the current electrodes and the Hall voltage electrodes, specifically according to the crystalline direction in which the current direction and the Hall voltage electrodes are aligned with respect to one another. Accordingly, to obtain a Hall element having a low unbalanced voltage, it is not enough to make said face parallel to the {110} plane if the current direction is random. It is preferable to restrict the current direction to a suitable crystalline direction in order to lower the unbalanced voltage.

Figure 1:
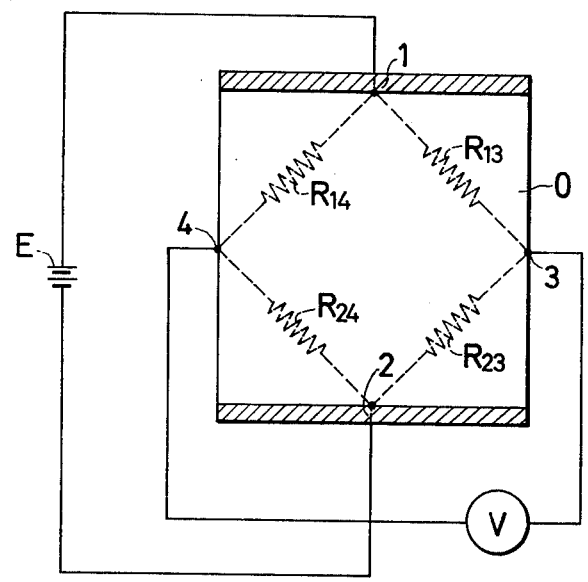
FIG. 1 is a model picture illustrating the equivalent circuit for explanation of the unbalanced voltage in a Hall element.

The equivalent circuit for a Hall element generating an unbalanced voltage $V_O$ will be discussed hereunder in order to investigate the above described problem. FIG. 1 is a model picture illustrating the equivalent circuit. The current electrodes 1 and 2 are fixed on a rectangular semiconductor substrate O, and a current source E is connected thereto in order to apply a controlling current to the Hall element. A voltmeter V of high internal resistance is connected to the Hall voltage output electrodes 3 and 4 to measure the unbalanced voltage $V_O$. The mechanism for the generation of the unbalanced voltage $V_O$ will be explained by the equivalent bridge circuit illustrated by the broken lines. $R_{ij}$ is the equivalent resistivity between electrode $i$ and electrode $j$. In this case, the unbalanced voltage $V_O$ is given by the next formula, where the current source voltage is $E_O$.

$$V_o = \frac{R_{13} \cdot R_{24} - R_{23} \cdot R_{14}}{(R_{14} + R_{24})(R_{13} + R_{23})} \cdot E_o \quad (1)$$

When no strain is applied to the element, it is assumed that the respective resistivities of the equivalent circuit become equal, that is $$R_{13} = R_{24} = R_{23} = R_{14} = R_o,$$

and $V_O$ becomes zero.

The resistivities will change according to the piezoresisitve effect when the strain is applied to the element. The resistivities of the equivalent circuit will then become unequal, and will generate a unbalanced voltage $V_O$ according to formula (1). If it is assumed that a stress $\sigma$ is applied parallel to $R_{13}$ or $R_{24}$ (in other words, normal to $R_{14}$ or $R_{23}$), the respective resistivities will be given by the following formulas, $$R_{13} = R_{24} = R_o(1 + \pi_l \sigma) \quad (2)$$

$$R_{14} = R_{23} = R_o(1 + \pi_t \sigma) \quad (3)$$

wherein $\pi_l$ is the longitudinal piezo-resistive coefficient and $\pi_t$ is the traverse piezo-resistive coefficient. In this case, the unbalanced voltage $V_O$ is given by the next formula which is derived from formulas (1), (2) and (3).

$$V_o = \frac{(1 + \pi_l \sigma)^2 - (1 + \pi_t \sigma)^2}{\left\{2 + (\pi_l + \pi_t)\sigma\right\}^2} \cdot E_o$$

$$= \frac{(\pi_l - \pi_t)\sigma}{2 + (\pi_l + \pi_t)\sigma} \cdot E_o \quad (4)$$

Formula (4) may be approximated by the next formula, as the inequality $2 >> (\pi_l + \pi_t)\sigma$ is generally acknowledged.

$$V_o = \frac{(\pi_l - \pi_t)\sigma}{2} \cdot E_o \quad (5)$$

Figure 2:
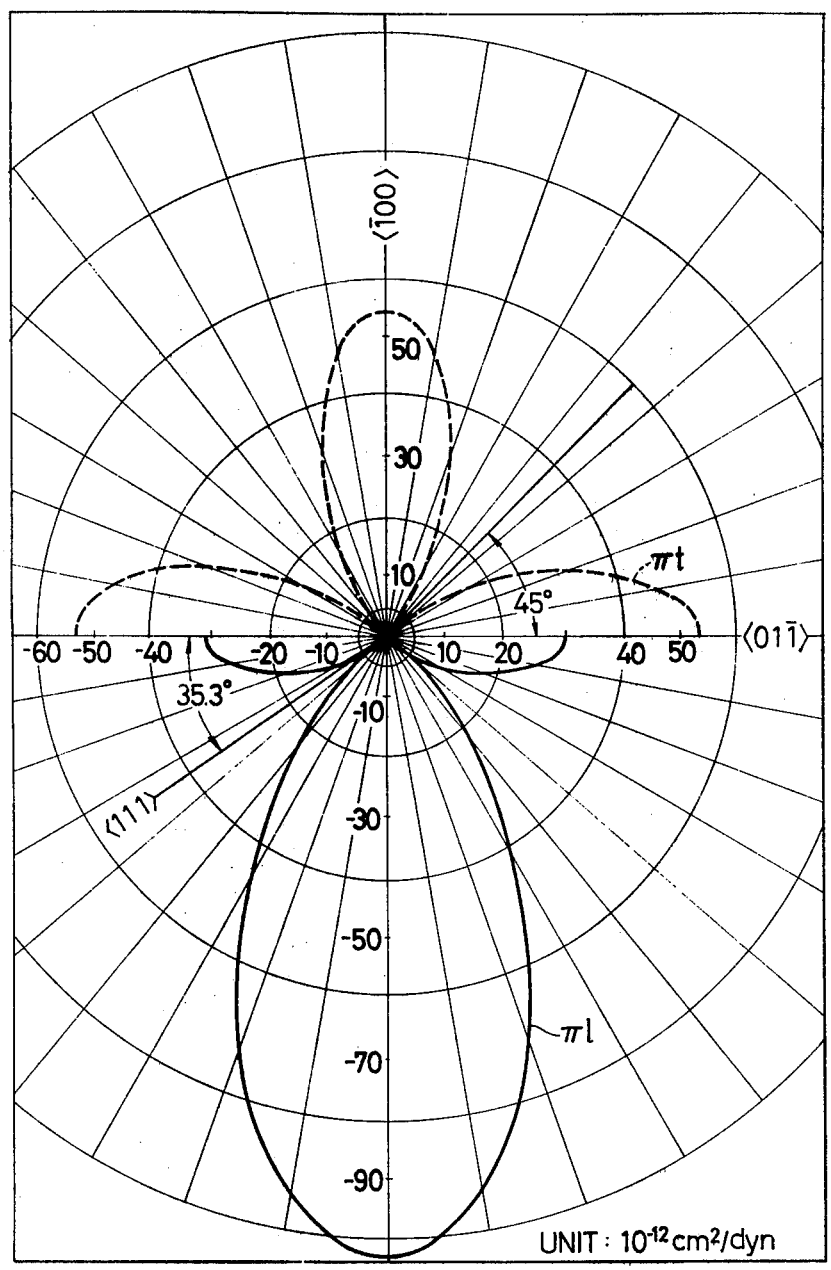
FIG. 2 shows the relation between the crystalline direction and the longitudinal piezo-resistive coefficient $\pi_l$ and the traverse piezo-resistive coefficient $\pi_t$ in the (011) atomic plane of n-type Si.

Therefore, the unbalanced voltage $V_O$ becomes a function of $\pi_l$ and $\pi_t$, and it becomes necessary to know the values of $\pi_l$ and $\pi_t$ for the solution for $V_O$. FIG. 2, made according to the results of studies by the inventors, shows the values of $\pi_l$ and $\pi_t$ corresponding to the various crystalline directions in the (011) atomic plane of n-type Si. The unit thereof is $10^{-12}$ cm$^2$/dyn. The solid line and the broken line represent $\pi_l$ and $\pi_t$ respectively. The former is negative and the latter is positive in value. As apparent from FIG. 2, the absolute value of $\pi_l$ is lowest at the <111> direction and $\pi_t$ assumes its lowest value, zero, at the crystalline direction which is at 45° from <01$\bar{1}$>. Accordingly $\pi_t$ becomes zero and the absolute value of $\pi_l$ also becomes very low when the thin rectangular semiconductor plate comprising the body portion of the Hall element has one pair of sides with a <01$\bar{1}$> direction and the other pair of sides with a <$\bar{1}$00> direction, specifically when, according to our invention, the current direction (which is defined in the foregoing) is substantially in the <100> or <110> crystalline direction, the direction from one Hall voltage electrode to the other Hall voltage electrode is substantially normal to the above mentioned current direction and the Hall voltage electrodes are on the middle line between current electrodes. In such a case, the unbalanced voltage $V_O$ obtained from formula (5) becomes very low.

EXAMPLE 1

Figure 3:
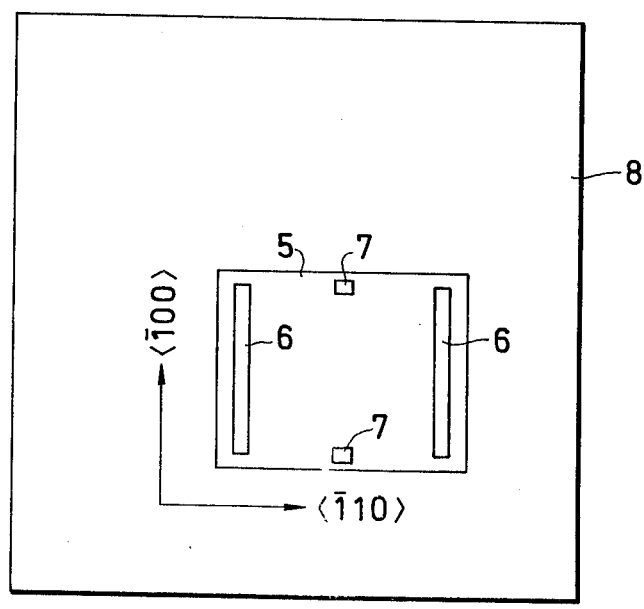
FIG. 3 is a plan view of the Hall element in an embodiment of the present invention.

The n-type Si having a specific resistivity of about 1 $\psi$-cm was epitaxially grown to a thickness of about 10 $\mu$m on a p-type Si wafer having a thickness of about 350 $\mu$m, a specific resistivity of about 20 $\psi$-cm and a mirror polished face with a (110) atomic plane. It was then heated to about 1100° C in an oxidizing atmosphere in order to form a SiO$_2$ layer of 7000 Å thickness on the surface. Next, a predetermined portion of said SiO$_2$ layer was removed by the well known photo-etching technique. Subsequently boron was diffused onto the bared portion of the epitaxial layer of n-type Si in order to isolate the not bared portion which we used as the body portion of the Hall element. FIG. 3 is a plan view of a Hall element formed on a Si pellet 8. In FIG. 3, numbers 5, 6 and 7 are the body portion of the Hall element, the current electrodes and the Hall voltage electrodes for the detection and measurement of the output Hall voltage, respectively. The electrode contact portions were formed by the diffusion of phosphorus to a high concentration at portions 6 and 7 thus obtaining a good electrical contact between the terminal and the semiconductor body. Furthermore, aluminum layers were deposited on predetermined part of said electrode contacting portions, by the evaporation method. Said aluminum layer is omitted in FIG. 3. The width of the body portion 5 of the Hall element is about 500 $\mu$m and the distance between the current electrodes, 6, is about 500 $\mu$m too.

On the other hand, said Hall element and a strain gauge were sticked on the position at a distance of 30 mm from the fixed end of a cantilever composed of a stainless steel plate having a length of 95 mm, a width of 13 mm and a thickness of 1 mm. The angular error of sticking was less than 10°. Furthermore, an insulated metallic electrode terminal plate, on which gold was plated, was positioned near said element and connected to said element with Al wire of 25 $\mu$m diameter. Ultrasonic bonding was used to connect the Al wire, while the lead wires used for measurements were soldered to the terminal plate.

A tensile or compressive strain was generated in the Hall element through a bending strain of the cantilever which was constructed as above and a load applied to the free end thereof. The magnitude of the resultant strain at which the unbalanced voltage $V_O$ was measured was $100 \times 10^{-6}$ strain. The current source voltage applied to the current electrodes was 5 V. The results are shown in Table 1.

In this example, the face of the thin Si plate, which comprises the body portion of the Hall element, was parallel to the (110) atomic plane while the current direction was <100>. Furthermore, the unbalanced voltages measured with the Hall elements having a face of (111) or (100) atomic plane and a current direction of <211> or <100> direction are listed in Table 1 as references. The values listed in Table 1 are the average values for 100 samples.

As apparent from the results listed in Table 1, the Hall element of the present invention is very excellent in that it has a very low unbalanced voltage even in cases of strain, because of the face of the Si thin plate being parallel to the {110} atomic plane.

Table 1

| Atomic plane | Unbalanced voltage (mV) |
| --- | --- |
| (011) | 3.2 |
| (111) | 20.0 |
| (100) | 42.0 |

EXAMPLE 2

Hall elements composed of n-type Si were made and the unbalanced voltages $V_O$ were measured in the same manner as in example 1. The faces of the thin Si plates comprising the Hall elements were made parallel to (110) atomic plane. The current directions were made <001> or <110> crystalline direction. Furthermore, Hall elements having other current directions were also tested as the reference examples. The results are listed in Table 2. Although $V_O$ was measured in the same manner as in example 1, the values listed in Table 2 are the average values for 25 samples.

As is shown in Table 2, the unbalanced voltage, $V_O$ of a Hall element composed of thin n-type Si plate having a face of {110} atomic plane is low even in the case of strain when the current direction is within $\pm 15°$ of <110> or <100> crystalline direction. It is lower than the unbalanced voltage in previous Hall elements composed of a thin Si plate having a face of {111} atomic plane. Thus, a Hall element which has a face of {110} atomic plane and a current direction of within $\pm 15°$ of <110> or <100> is very excellent. The unbalanced voltage $V_O$ is especially low when the current direction is <110> or <100>.

Table 2

| Current direction | Unbalanced voltage (mV) |
| --- | --- |
| <110> | 3.3 |
| 5 degrees of <110> | 8 |
| 10 degrees of <110> | 16 |
| 15 degrees of <110> | 24 |
| <100> | 3.5 |
| 5 degrees of <100> | 10 |
| 10 degrees of <100> | 18 |
| 15 degrees of <100> | 25 |

EXAMPLE 3

The procedure of Example 1 was repeated with the exception that the transistors, diodes, resistors etc. were provided on the pellets, 8, FIG. 3, outside of the body portion of the Hall element to form integrated circuits. The pellets, 8, were 2 by 2 millimeters in size. A laser cutter was used to cut the pellets. The pellets were bonded at 400° C to a frame made of phosphor bronze on which gold had been plated. Gold wires of 20 μm diameter were also attached for wiring by the wire-bonding technique. Then, they were moulded with resin.

The unbalanced voltage $V_O$ was measured by applying 5 V between the current electrodes, 6 in FIG. 3, of a Hall element prepared as mentioned above. 85 out of 100 samples had $V_O$s of not more than 5 mV. These samples had faces of (110) atomic plane and current directions of <110> or <100>. On the other hand, when the faces of the elements were made (111) atomic plane and the current direction was made <211>, there were only 25 out of 100 samples with a $V_O$ of less than 5 mV.

As mentioned above, a Hall element with a face of 110 atomic plane and a current direction of <110> or <100> according to the present invention, is superior in terms of low unbalanced voltage even after packaging.

What is claimed is:

1. A Hall element for reducing unbalanced voltages comprising
   a thin element of n-type Si having two parallel major surfaces, each of said major surfaces being substantially parallel to the {110} crystalline atomic plane,
   a pair of current electrodes for applying current across said thin Si element, said pair of current electrodes being separated across at least one of said major surfaces in a first direction within $\pm 15°$ of one of the <100> and <110> crystalline directions, and
   a pair of Hall voltage electrodes for providing a Hall voltage output, said pair of voltage electrodes being separated across said major surface in a second direction substantially normal to said first direction, wherein said thin Si element is rectangular and has a first pair of side edges substantially parallel to said first direction and a second pair of side edges substantially perpendicular to said first direction, and wherein said current electrodes are arranged at said second pair of side edges and said Hall voltage electrodes are arranged at said first pair of side edges.

2. A Hall element according to claim 1, wherein said first direction is within $\pm 15°$ if the <100> crystalline direction.

3. A Hall element according to claim 2, wherein said thin Si element is provided on a pellet together with at least one of active elements and passive elements, and said pellet is packaged.

4. A Hall element according to claim 2, wherein said first direction is substantially in the <100> crystalline direction.

5. A Hall element according to claim 4, wherein said thin Si element is provided on a pellet together with at least one of active elements and passive elements, and said pellet is packaged.

6. A Hall element according to claim 1, wherein said first direction is within $\pm 15°$ of the <110> crystalline direction.

7. A Hall element according to claim 6, wherein said thin Si element is provided on a pellet together with at least one of active elements and passive elements, and said pellet is packaged.

8. A Hall element according to claim 6, wherein said first direction is substantially in the <110> crystalline direction.

9. A Hall element according to claim 8, wherein said thin Si element is provided on a pellet together with at least one of active elements and passive elements, and said pellet is packaged.

10. A Hall element according to claim 1, wherein said thin Si element is a rectangular plate, and wherein said current electrodes and said Hall voltage electrodes are in ohmic contact with said element.

11. A Hall element according to claim 1, wherein said thin Si element is provided on a pellet together with at least one of active elements and passive elements.

* * * * *